(12) United States Patent
Nomiya et al.

(10) Patent No.: US 11,519,790 B2
(45) Date of Patent: Dec. 6, 2022

(54) TEMPERATURE SENSOR, CIRCUIT DEVICE, OSCILLATOR, ELECTRONIC APPARATUS, AND VEHICLE

(71) Applicant: SEIKO EPSON CORPORATION, Tokyo (JP)

(72) Inventors: Takashi Nomiya, Matsumoto (JP); Mitsuaki Sawada, Fujimi-machi (JP); Naoki Ii, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 299 days.

(21) Appl. No.: 16/831,491

(22) Filed: Mar. 26, 2020

(65) Prior Publication Data
US 2020/0309606 A1   Oct. 1, 2020

(30) Foreign Application Priority Data

Mar. 27, 2019   (JP) .............................. JP2019-060163

(51) Int. Cl.
*G01K 7/01*   (2006.01)
*H03B 5/04*   (2006.01)

(52) U.S. Cl.
CPC ................. *G01K 7/01* (2013.01); *H03B 5/04* (2013.01); *H03B 2200/0038* (2013.01)

(58) Field of Classification Search
CPC ........................................................ G01K 7/01
USPC ........................................................ 374/178
See application file for complete search history.

(56) References Cited

U.S. PATENT DOCUMENTS

| 5,955,793 A * | 9/1999 | Khadkikar | ............... G01K 7/01 307/130 |
| 2009/0091373 A1 | 4/2009 | Kiyohara | |

FOREIGN PATENT DOCUMENTS

| DE | 141354 | 4/1980 |
| JP | H10-341111 A | 12/1998 |
| JP | 2009-092449 A | 4/2009 |

* cited by examiner

*Primary Examiner* — Joseph Chang
(74) *Attorney, Agent, or Firm* — Rankin, Hill & Clark LLP

(57) ABSTRACT

Provided is a temperature sensor including a bipolar transistor, a resistor, and a variable resistance circuit. The resistor is provided between a first node coupled to a base node of the bipolar transistor and a collector node of the bipolar transistor. The variable resistance circuit is provided between an emitter node of the bipolar transistor and a ground node.

21 Claims, 10 Drawing Sheets

TEMPERATURE SENSOR, CIRCUIT DEVICE, OSCILLATOR, ELECTRONIC APPARATUS, AND VEHICLE

The present application is based on, and claims priority from JP Application Serial Number 2019-060163, filed Mar. 27, 2019, the disclosure of which is hereby incorporated by reference herein in its entirety.

BACKGROUND

1. Technical Field

The present disclosure relates to a temperature sensor, a circuit device, an oscillator, an electronic apparatus, and a vehicle.

2. Related Art

A forward voltage has temperature characteristics in a PN junction of a semiconductor, and a temperature sensor using the temperature characteristics is known. As the forward voltage having the temperature characteristics, for example, a voltage between the base and emitter of a bipolar transistor or the like is used.

A temperature sensor in JP-A-2009-92449 includes a bipolar transistor, a first resistor, and a second resistor coupled in series. Abase node of the bipolar transistor and a node between the first resistor and the second resistor are coupled, and a temperature detection voltage is output from a collector node of the bipolar transistor. JP-A-2009-92449 discloses a configuration in which a sensitivity correction of the temperature detection voltage is performed by changing a current passed through the bipolar transistor. The sensitivity is a slope of the temperature detection voltage with respect to the temperature change.

In the temperature sensor as described above, it is desired that an offset of the temperature detection voltage can be corrected with high accuracy with a simple circuit configuration. JP-A-2009-92449 describes the sensitivity correction of the temperature detection voltage but does not describe the offset correction of the temperature detection voltage.

SUMMARY

An aspect of the present disclosure relates to a temperature sensor for outputting a temperature detection voltage, including: a first bipolar transistor; a first resistor provided between a first node coupled to a first base node that is a base node of the first bipolar transistor and a first collector node that is a collector node of the first bipolar transistor; and a first variable resistance circuit provided between a first emitter node that is an emitter node of the first bipolar transistor and a ground node.

DESCRIPTION OF EXEMPLARY EMBODIMENTS

Hereinafter, the desired embodiments of the present disclosure will be described in detail. Note that the present embodiment described below does not unduly limit the contents described in the scope of the appended claims, and all the configurations described in the present embodiment are not necessarily essential components.

1. Oscillator, Circuit Device

Hereinafter, a case where a temperature sensor is used for a temperature compensation in an oscillator will be described as an example, but an application target of the temperature sensor according to the present disclosure is not limited thereto. For example, the temperature sensor according to the present disclosure can be applied to a single temperature sensor. Alternatively, the temperature sensor according to the present disclosure can be applied to a circuit device including a temperature sensor and a circuit that operates based on a temperature detection voltage from the temperature sensor.

Figure 1:
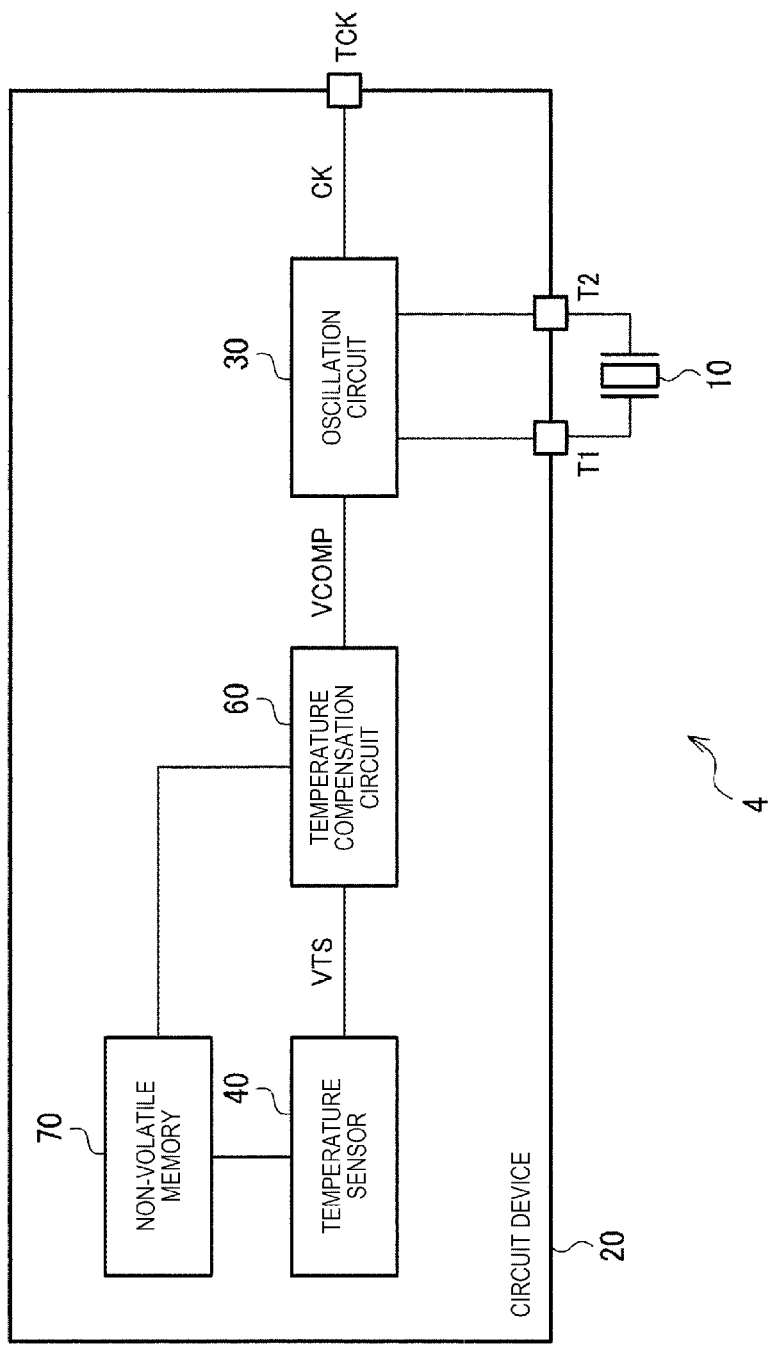
FIG. 1 shows a configuration example of a circuit device and an oscillator.

FIG. 1 is a configuration example of a circuit device 20 including a temperature sensor 40, and an oscillator 4 including the circuit device 20. The oscillator 4 includes a vibrator 10 and the circuit device 20. The vibrator 10 is electrically coupled to the circuit device 20. For example, the vibrator 10 and the circuit device 20 are electrically coupled using an internal wiring, a bonding wire, a metal bump, or the like of a package that accommodates the vibrator 10 and the circuit device 20.

The vibrator 10 is an element generating mechanical vibration by an electric signal. The vibrator 10 can be realized by a vibrator element such as a quartz crystal vibrator element, for example. For example, the vibrator 10 can be realized by a quartz crystal vibrator element in which a cut angle vibrates in a thickness-slide manner such as an AT cut or an SC cut. For example, the vibrator 10 may be a vibrator of a simple packaged crystal oscillator (SPXO). Alternatively, the vibrator 10 may be a vibrator built in a constant temperature oven controlled crystal oscillator (OCXO) having a constant temperature oven, or a vibrator built in a temperature compensated crystal oscillator (TCXO) having no constant temperature oven. Note that the vibrator 10 according to the present embodiment can be realized by various vibrator elements such as vibrator elements other than a thickness-slide vibration type or piezoelectric vibrator elements formed of materials other than quartz crystal. For example, as the vibrator 10, a surface acoustic wave (SAW) resonator, a micro electro mechanical systems (MEMS) vibrator as a silicon vibrator formed using a silicon substrate, or the like may be adopted.

The circuit device 20 is an integrated circuit device called an integrated circuit (IC). For example, the circuit device 20 is an IC manufactured by a semiconductor process, and is a semiconductor chip in which circuit elements are formed on a semiconductor substrate. The circuit device 20 includes an oscillation circuit 30, a temperature sensor 40, a temperature compensation circuit 60, a non-volatile memory 70, and terminals T1, T2, and TCK.

The terminals T1, T2, and TCK are, for example, pads of the circuit device 20. The terminal T1 is electrically coupled to one end of the vibrator 10, and the terminal T2 is electrically coupled to the other end of the vibrator 10. For example, the vibrator 10, and the terminals T1 and T2 are electrically coupled with each other using an internal wiring, a bonding wire, a metal bump, or the like of a package that accommodates the vibrator 10 and the circuit device 20. The terminal TCK is a terminal from which a clock signal CK generated by the circuit device 20 is output. The terminal TCK is electrically coupled to an external terminal for external coupling of the oscillator 4. For example, the terminal TCK and the external terminal are electrically coupled with each other using the internal wiring, the bonding wire, the metal bump, or the like of the package. The external terminal of the oscillator 4 is electrically coupled to an external device.

The temperature sensor 40 is a sensor that detects temperature. Specifically, the temperature sensor 40 uses a temperature dependency of a forward voltage of the PN junction to output a temperature detection voltage VTS in which a voltage value changes depending on the temperature. Further, the temperature sensor 40 performs an offset correction of the temperature detection voltage VTS based on zeroth-order correction data stored in the non-volatile memory 70. That is, the temperature sensor 40 adjusts an offset of the temperature detection voltage VTS by the offset indicated by the zeroth-order correction data. Note that the offset correction of the temperature detection voltage VTS corresponds to the zeroth-order correction in the temperature compensation of the oscillation frequency.

The temperature compensation circuit 60 outputs a compensation voltage VCOMP based on the temperature detection voltage VTS, thereby the oscillation frequency of the oscillation circuit 30 is temperature compensated. The compensation voltage VCOMP is a voltage that cancels or reduces the temperature characteristics of the oscillation frequency. The temperature compensation circuit 60 outputs the compensation voltage VCOMP by polynomial approximation with temperature as a variable. For example, when the temperature detection voltage VTS is approximated by a fifth-order polynomial, a zeroth-order coefficient, a first-order coefficient, a second-order coefficient, a third-order coefficient, a fourth-order coefficient, and a fifth-order coefficient of the polynomial are stored in the non-volatile memory 70 as zeroth-order correction data, first-order correction data, second-order correction data, third-order correction data, fourth-order correction data, and fifth-order correction data, respectively. The temperature compensation circuit 60 performs a temperature compensation based on the first-order correction data, the second-order correction data, the third-order correction data, the fourth-order correction data, and the fifth-order correction data. As described above, the zeroth-order correction is performed by the temperature sensor 40. The polynomial approximation is not limited to the fifth-order.

The non-volatile memory 70 stores temperature compensation data used for a temperature compensation of the oscillation frequency. The temperature compensation data is the above-mentioned zeroth-order correction data, first-order correction data, second-order correction data, third-order correction data, fourth-order correction data, and fifth-order correction data. For example, when the oscillator 4 is manufactured, a test device measures the temperature characteristics of the oscillation frequency based on a clock signal CK output from the oscillator 4. The test device obtains a coefficient of each term by polynomial approximation of the measured temperature characteristics and writes the coefficient into the non-volatile memory 70 as temperature compensation data.

The non-volatile memory 70 is, for example, an electrically erasable programmable read only memory (EEPROM) or a flash memory. The EEPROM can be realized by, for example, a floating gate type memory cell. The flash memory can be realized by, for example, a metal oxide nitride oxide silicon (MONOS) memory cell. Alternatively, a non-volatile memory 150 may be a memory using a fuse cell. In this type of memory, the fuse cell that is a memory cell includes a resistor and a selector element coupled in series to the resistor. The selector element is, for example, a PN junction diode or a MOS transistor. For example, one end of the resistor is coupled to a bit line, and the other end of the resistor is coupled to an anode of the diode. A cathode of the diode is coupled to a word line. The resistor that functions as a fuse element is a programmable resistor having a variable resistance value. By using the variable resistance value, data is stored in the fuse cell.

The oscillation circuit 30 is a circuit that oscillates the vibrator 10. For example, the oscillation circuit 30 is electrically coupled to the terminal T1 and the terminal T2, and causes the vibrator 10 to oscillate. As the oscillation circuit 30, various types of oscillation circuits can be used such as a Pierce type, a Colpitts type, an inverter type, or a Hartley type. The oscillation circuit 30 cancels or reduces the temperature characteristics of the oscillation frequency based on the compensation voltage VCOMP. For example, the oscillation circuit 30 includes a variable capacitance capacitor in which a capacity is variably controlled by a potential difference between both ends. One end of the variable capacitance capacitor is electrically coupled to the terminal T1 or the terminal T2, and the compensation voltage VCOMP is input to the other end of the variable capacitance capacitor.

The clock signal CK is output based on the oscillation signal. For example, the oscillation circuit 30 may include a buffer circuit, and the buffer circuit may output the clock signal CK by buffering the oscillation signal. Alternatively, the circuit device 20 may include an output circuit (not shown). The output circuit can include a dividing circuit that divides a transmission signal and a buffer circuit that outputs the clock signal CK by buffering an output clock signal of the dividing circuit.

The coupling in the present embodiment is an electrical coupling. The electrical coupling is a coupling to which an electrical signal is transmittable, and a coupling that enables transmission of information by an electrical signal. The electrical coupling may be a coupling via an active element or the like.

2. First and Second Configuration Examples of Temperature Sensor

Next, the affection of an offset of a temperature detection voltage on a temperature compensation of an oscillation frequency will be described with reference to FIGS. 2 to 4.

Figure 5:
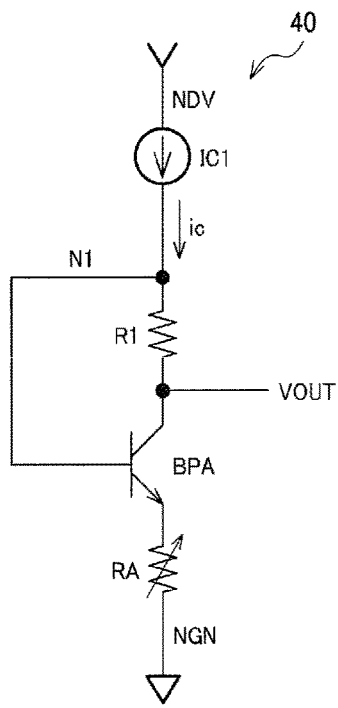
FIG. 5 shows a first configuration example of a temperature sensor.

In FIG. 5 and subsequent figures, a detailed configuration example of a temperature sensor 40 will be described.

Figure 2:
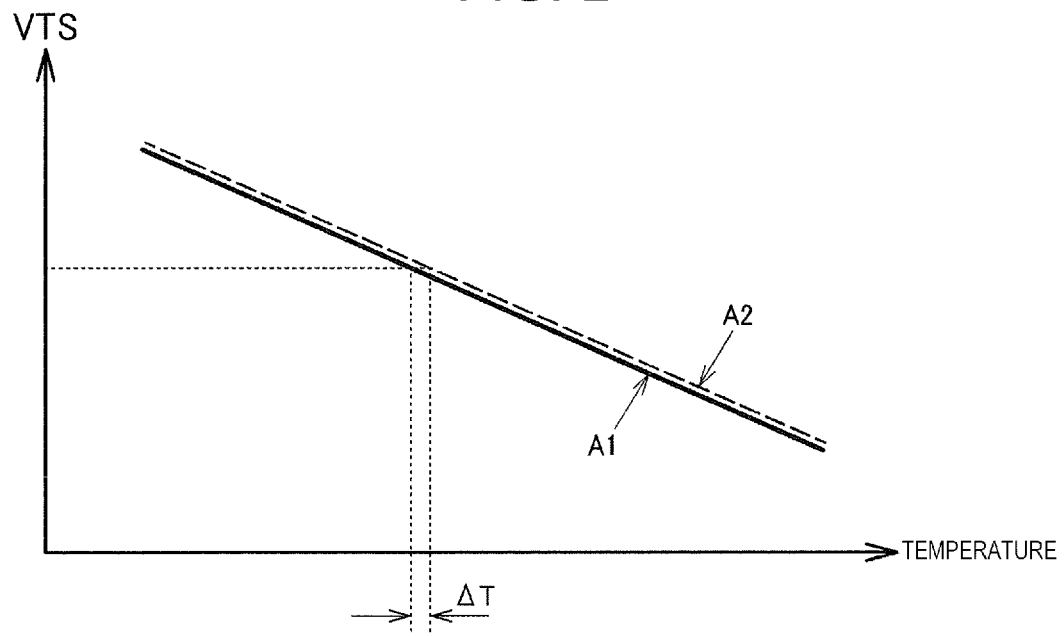
FIG. 2 shows a characteristic example of a temperature detection voltage.

FIG. 2 is a characteristic example of a temperature detection voltage VTS. As shown in FIG. 2, the temperature detection voltage VTS generated based on a forward voltage of a PN junction has a negative temperature characteristic and is represented as a linear function with respect to temperature. A1 is an ideal characteristic of the temperature detection voltage VTS, and A2 is a characteristic of the temperature detection voltage VTS in which the offset fluctuates with respect to A1. The offset fluctuation of the linear function can be considered as a shift in a temperature direction. As shown in FIG. 2, a temperature shift amount of A2 to A1 is set to $\Delta T$.

Figure 3:
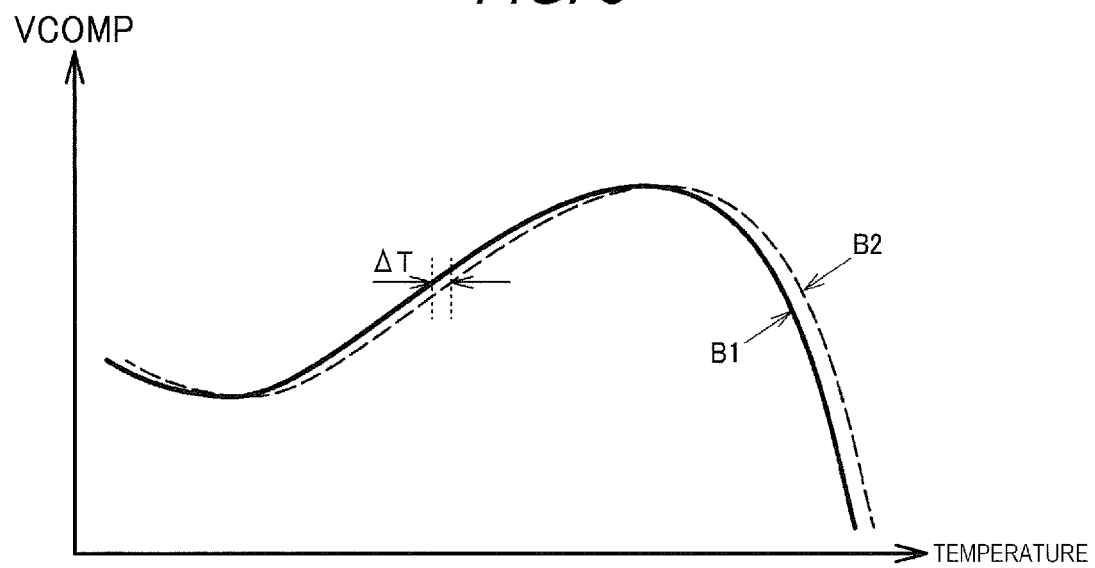
FIG. 3 shows a characteristic example of a compensation voltage.

FIG. 3 is a characteristic example of the compensation voltage VCOMP. Due to the temperature characteristics included in the oscillation frequency of the vibrator 10 or the temperature characteristics included in the variable capacitance capacitor of the oscillation circuit 30, the oscillation frequency of the oscillation circuit 30 includes temperature characteristics. The compensation voltage VCOMP for compensating the temperature characteristics is represented as, for example, a fifth-order polynomial function with respect to temperature. Let B1 be a characteristic of the compensation voltage VCOMP that can ideally temperature compensate the oscillation frequency. That is, it is assumed that the temperature compensation circuit outputs the compensation voltage VCOMP shown in B1 when the temperature detection voltage VTS shown in A1 in FIG. 2 is input from the temperature sensor 40.

As shown in A2 in FIG. 2, it is assumed that the temperature detection voltage VTS is shifted by a temperature shift amount $\Delta T$ due to the offset. This is because the temperature measurement result is shifted by $\Delta T$, and as shown by B2 in FIG. 3, the compensation voltage VCOMP is also shifted in the temperature direction by $\Delta T$. That is, the compensation voltage VCOMP has an error with respect to the ideal compensation voltage VCOMP.

Figure 4:
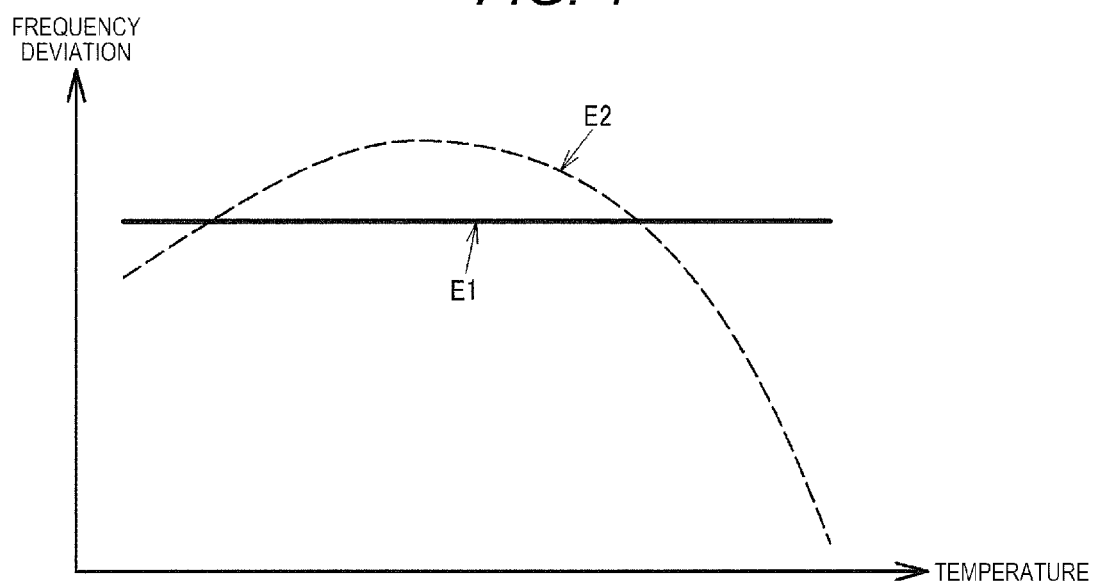
FIG. 4 shows a characteristic example of a frequency deviation.

FIG. 4 is a characteristic example of a frequency deviation. The ratio of a difference between an oscillation frequency and a nominal frequency to the nominal frequency is the frequency deviation. E1 is a characteristic of frequency deviation when the temperature compensation is performed by the ideal compensation voltage VCOMP shown in B1 in FIG. 3. In E1, the frequency deviation is substantially constant with respect to the temperature. E2 is a characteristic of frequency deviation when the temperature compensation is performed by the compensation voltage VCOMP shown in B2 in FIG. 3. The characteristic has a larger fluctuation in frequency deviation than the ideal characteristic of E1. This is because the compensation voltage VCOMP is shifted in the temperature direction due to the offset of the temperature detection voltage VTS.

The characteristic indicated by E2 has a second-order component with respect to temperature. When an adjustment range of a correction performed by the temperature compensation circuit with respect to the second-order component is small, the second-order component of the frequency deviation such as E2 cannot be sufficiently corrected. The temperature sensor 40 of the present embodiment can cancel or reduce the temperature shift amount $\Delta T$ as shown in FIG. 2 by adjusting the offset of the temperature detection voltage VTS. Thereby, the accuracy of temperature compensation can be improved. That is, the frequency deviation after temperature compensation can be close to an ideal characteristic as indicated by E1 in FIG. 4.

FIG. 5 is a first configuration example of the temperature sensor 40. The temperature sensor 40 includes a bipolar transistor BPA, a resistor R1, a variable resistance circuit RA, and a constant current circuit IC1. BPA, R1, and RA are a first bipolar transistor, a first resistor, and a first variable resistance circuit, respectively.

The constant current circuit IC1 is provided between a power supply node NVD and a first node N1, and outputs a constant current ic to the first node N1. For example, the constant current circuit IC1 includes a resistor provided between the power supply node NVD and a ground node NGN, and a current mirror circuit that outputs the constant current ic by mirroring a current flowing through the resistor.

The first node N1 is coupled to a base node of the bipolar transistor BPA. The resistor R1 is provided between the first node N1 and a collector node of the bipolar transistor BPA. That is, one end of the resistor R1 is coupled to the first node N1, and the other end of the resistor R1 is coupled to the collector node of the bipolar transistor BPA.

The variable resistance circuit RA is provided between an emitter node of the bipolar transistor BPA and the ground node NGN. That is, one end of the variable resistance circuit RA is coupled to an emitter node of the bipolar transistor BPA, and the other end of the variable resistance circuit RA is coupled to the ground node NGN. Zeroth-order correction data is input to the variable resistance circuit RA from the non-volatile memory 70 in FIG. 1, and a resistance value of the variable resistance circuit RA is set by the zeroth-order correction data.

In the first configuration example, a collector voltage of the bipolar transistor BPA is set as an output voltage VOUT. As will be described later with reference to FIG. 9, the buffer circuit 42 outputs the temperature detection voltage VTS by buffering the output voltage VOUT. The buffer circuit 42 is a unity gain buffer. That is, the temperature detection voltage VTS is basically the same as the output voltage VOUT. However, the buffer circuit 42 has a function of further finely adjusting the offset of the temperature detection voltage VTS. Note that the temperature sensor 40 may output the output voltage VOUT as the temperature detection voltage VTS without providing the buffer circuit 42.

The output voltage VOUT is shown in the following equation (1). VbeA is a voltage between the base and emitter of the bipolar transistor BPA.

$$VOUT = VbeA + ic \times (RA - R1) \quad (1)$$

As shown in the above equation (1), VOUT includes $ic \times (RA-R1)$ as an offset component. That is, the offset of VOUT can be adjusted by changing a resistance value of the variable resistance circuit RA.

Figure 7:
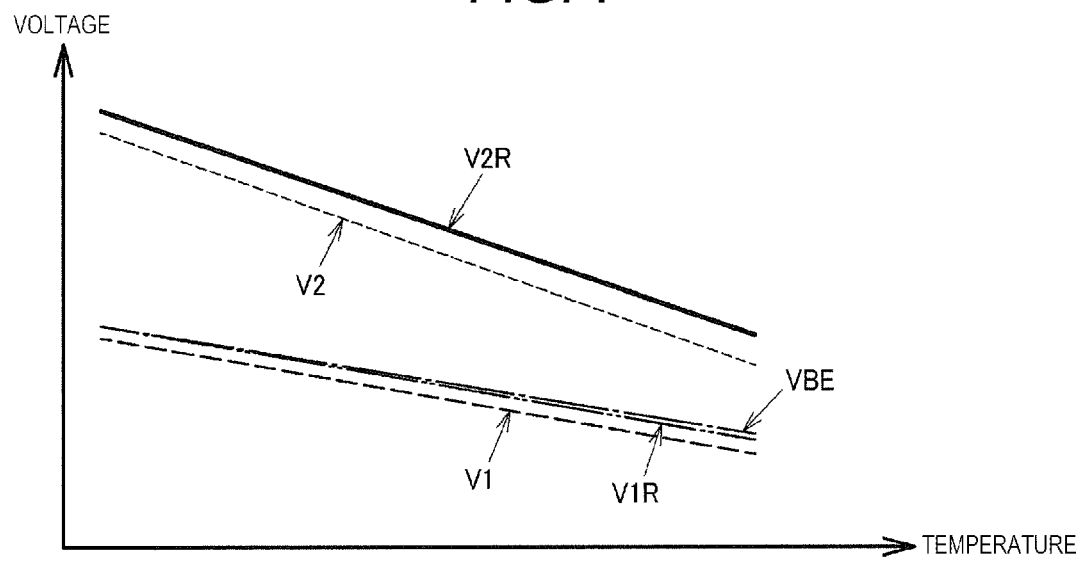
FIG. 7 shows a temperature characteristic example of an output voltage.

FIG. 7 shows an example of temperature characteristics of the output voltage VOUT. VBE is a temperature characteristic of a voltage between the base and emitter of the bipolar transistor.

V1R is a characteristic of the output voltage VOUT in the first configuration example. V1 is a characteristic of the output voltage VOUT when the variable resistance circuit RA is not provided in the first configuration example. V1R has a positive offset with respect to V1. That is, it can be seen that the offset can be added to the output voltage VOUT by providing the variable resistance circuit RA. Further, as described in the above equation (1), the offset can be adjusted by changing the resistance value of the variable resistance circuit RA.

Figure 6:
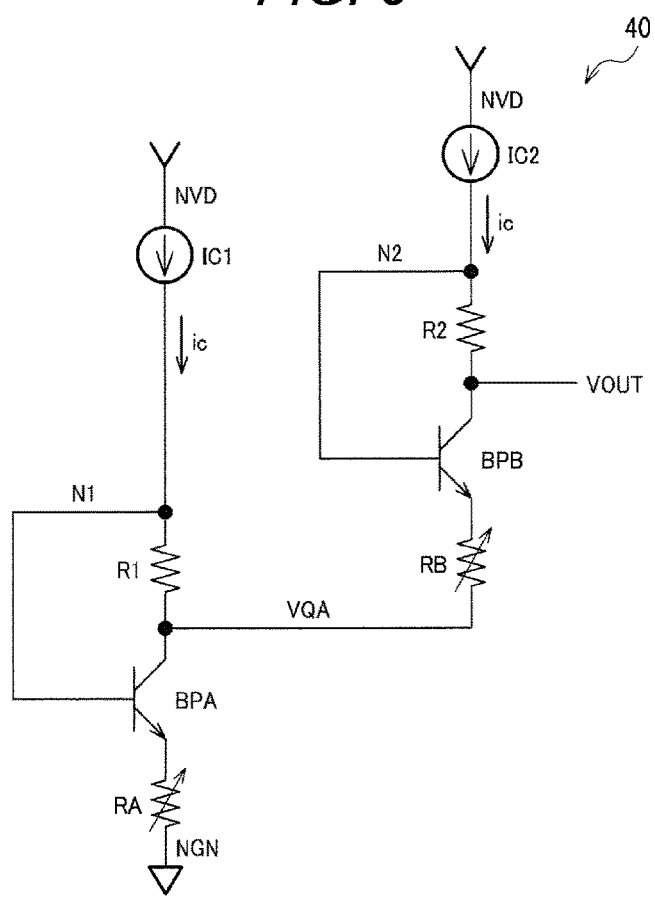
FIG. 6 shows a second configuration example of the temperature sensor.

FIG. 6 is a second configuration example of the temperature sensor 40. The temperature sensor 40 includes bipolar transistors BPA and BPB, resistors R1 and R2, variable resistance circuits RA and RB, and constant current circuits IC1 and IC2. BPB, R2, and RB are a second bipolar transistor, a second resistor, and a second variable resistance circuit, respectively.

The coupling of the constant current circuit IC1, the resistor R1, the bipolar transistor BPA, and the variable resistance circuit RA is the same as in the first configuration example.

The constant current circuit IC2 is provided between a power supply node NVD and a second node N2, and outputs a constant current ic to the second node N2. For example, the constant current circuit IC2 includes a resistor provided between the power supply node NVD and a ground node NGN, and a current mirror circuit that outputs the constant current ic by mirroring a current flowing through the resistor.

The second node N2 is coupled to a base node of the bipolar transistor BPB. The resistor R2 is provided between the second node N2 and a collector node of the bipolar transistor BPB. That is, one end of the resistor R2 is coupled to the second node N2, and the other end of the resistor R2 is coupled to the collector node of the bipolar transistor BPB.

The variable resistance circuit RB is provided between an emitter node of the bipolar transistor BPB and a collector node of the bipolar transistor BPA. That is, one end of the variable resistance circuit RB is coupled to the emitter node of the bipolar transistor BPB, and the other end of the variable resistance circuit RB is coupled to the collector node of the bipolar transistor BPA. Zeroth-order correction data is input to the variable resistance circuit RB from the non-volatile memory 70 in FIG. 1, and a resistance value of the variable resistance circuit RB is set by the zeroth-order correction data.

In the second configuration example, the collector voltage of the bipolar transistor BPA is set to the voltage VQA, and the collector voltage of the bipolar transistor BPB is set to the output voltage VOUT.

The voltage VQA is shown in the following equation (2). Further, by using the following equation (2), the output voltage VOUT is expressed as the following equation (3). VbeB is a voltage between the base and emitter of the bipolar transistor BPA.

$$VQA = VbeA + ic \times (2RA - R1) \quad (2)$$

$$\begin{aligned}VOUT &= VbeB + ic \times (RB - R2) + VQA \\ &= VbeA + VbeB + ic \times (2RA + RB - R1 - R2)\end{aligned} \quad (3)$$

As shown in the above equation (3), VOUT includes $ic \times (2RA+RB-R1-R2)$ as an offset component. That is, the offset of VOUT can be adjusted by changing a resistance value of the variable resistance circuit RA and the resistance value of the variable resistance circuit RB.

V2R shown in FIG. 7 is a characteristic of the output voltage VOUT in the second configuration example. V2 is a characteristic of the output voltage VOUT when the variable resistance circuit RA and the variable resistance circuit RB are not provided in the second configuration example. V2R has a positive offset with respect to V2. That is, it can be seen that the offset can be added to the output voltage VOUT by providing the variable resistance circuit RA and the variable resistance circuit RB. Further, as described in the above equation (3), the offset can be adjusted by changing a resistance value of the variable resistance circuit RA and a resistance value of the variable resistance circuit RB. In the second configuration example, since the bipolar transistor has two stages, two voltages between the base and emitter of the bipolar transistor are added. Thereby, a slope of the output voltage VOUT to the temperature becomes larger as compared with the slope in the first configuration example. That is, a temperature detection voltage having a higher sensitivity to the temperature can be obtained as compared with that of the first configuration example.

The temperature sensor 40 only needs to include at least one of the variable resistance circuit RA and the variable resistance circuit RB. In FIG. 6, the temperature sensor 40 includes the variable resistance circuit RA and the variable resistance circuit RB, but the variable resistance circuit RA may be omitted. In this case, the emitter node of the bipolar transistor BPA is coupled to the ground node NGN, and the offset of the output voltage VOUT is adjusted by the resistance value of the variable resistance circuit RB.

Figure 8:
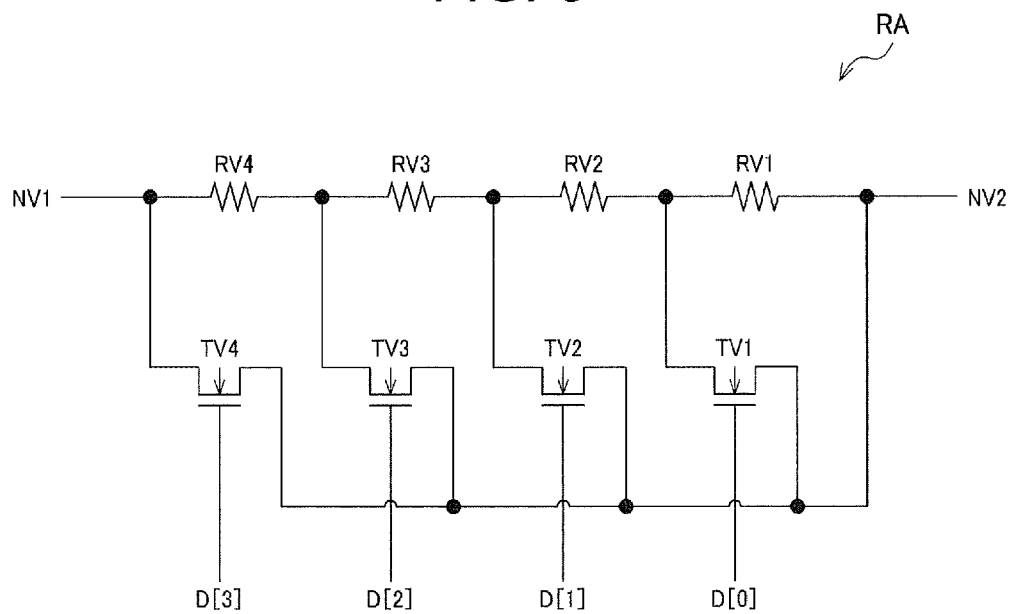
FIG. 8 shows a detailed configuration example of a variable resistance circuit.

FIG. 8 is a detailed configuration example of the variable resistance circuit RA. Variable resistance circuit RA includes resistors RV1 to RV4 and transistors TV1 to TV4. The transistors TV1 to TV4 are switches. FIG. 8 shows an example in which the variable resistance circuit RA includes four resistors and four switches. However, the variable resistance circuit RA only needs to include a plurality of resistors and a plurality of switches.

The resistors RV1 to RV4 are coupled in series between a node NV1 and a node NV2. Node NV1 is coupled to the emitter node of bipolar transistor BPA, and node NV2 is coupled to the ground node NGN.

The transistors TV1 to TV4 are, for example, N-type transistors. Each transistor is coupled between one end of one of the resistors RV1 to RV4, and the node NV2. Specifically, drains of TV1, TV2, TV3, and TV4 are coupled to ends of resistors RV1, RV2, RV3, and RV4, respectively. Sources of TV1, TV2, TV3, and TV4 are coupled to the node NV2. Note that one end of the resistor RV4 is coupled to the node NV1, and the other end of resistor RV1 is coupled to the node NV2.

Bit signals D[0], D[1], D[2] and D[3] are input to gates of the transistors TV1, TV2, TV3, and TV4, respectively. D[3:0] is zeroth-order correction data. All bits of D[3:0] are "0", or any one bit of D[3:0] is "1". That is, all of the transistors TV1 to TV4 are turned off, or any one of the transistors TV1 to TV4 is turned on. As described above, the resistance value of the variable resistance circuit RA is adjusted by the zeroth-order correction data, and thereby the offset of the temperature detection voltage is adjusted.

The variable resistance circuit RB has the same configuration as that shown in FIG. 8. When the configuration in FIG. 8 is applied to the variable resistance circuit RB, the node NV1 is coupled to the emitter node of the bipolar transistor BPB, and the node NV2 is coupled to the collector node of the bipolar transistor BPA.

According to the embodiment described with reference to FIGS. 5 to 8, the variable resistance circuit RA is provided between the emitter node of the bipolar transistor BPA and the ground node NGN, so that the offset of the temperature detection voltage can be adjusted with high accuracy with a simple circuit configuration.

For example, from the above equation (1), the offset of the temperature detection voltage can also be adjusted by making the resistance value of the resistor R1 variable. However, since the resistance value of the resistor R1 can be adjusted only within a range in which the bipolar transistor BPA can operate, an offset adjustment range is limited. On the other hand, in the present embodiment, since the variable resistance circuit RA is provided between the emitter node of the bipolar transistor BPA and the ground node NGN, the offset adjustment range can be secured.

Further, from the above equation (1), the offset of the temperature detection voltage can also be adjusted by making a current value of the constant current ic variable. However, since the constant current circuit IC1 is provided between the power supply node NVD and the first node N1, the adjustment of the constant current ic is easily affected by the power supply voltage, and the accuracy of the offset adjustment is lowered. On the other hand, in the present embodiment, since the variable resistance circuit RA is provided between the emitter node of the bipolar transistor BPA and the ground node NGN, the offset adjustment with a small dependency with respect to the power supply voltage is possible.

3. Third Configuration Example of Temperature Sensor

Figure 9:
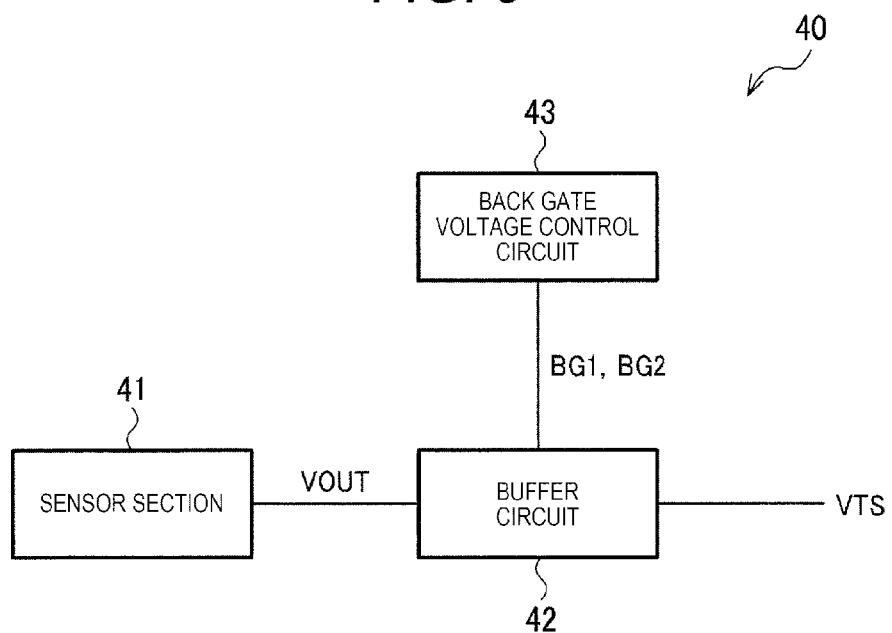
FIG. 9 shows a third configuration example of the temperature sensor.

FIG. 9 is a third configuration example of the temperature sensor 40. The temperature sensor 40 includes a sensor section 41, a buffer circuit 42, and a back gate voltage control circuit 43.

The sensor section 41 outputs an output voltage VOUT in which a voltage value changes depending on the temperature. Specifically, the sensor section 41 is the circuit described in FIG. 5 or FIG. 6.

The buffer circuit 42 outputs the temperature detection voltage VTS by buffering the output voltage VOUT from the sensor section 41. The buffer circuit 42 is an amplifier circuit of a gain 1, for example. The buffer circuit 42 includes a differential section, and the differential section includes a current mirror circuit and a differential pair transistor electrically coupled to the current mirror circuit.

The back gate voltage control circuit 43 controls a back gate voltage by outputting voltages BG1 and BG2 to back gates of transistors constituting the current mirror circuit. The offset of the output voltage of the differential section is controlled by controlling the back gates of the transistors constituting the current mirror circuit. Thereby, the offset of the temperature detection voltage VTS output from the buffer circuit 42 is adjusted. The offset adjustment by the variable resistance circuit of the sensor section 41 is a coarse adjustment, and the offset adjustment by the control of the back gate voltage is a fine adjustment. That is, one step of the offset adjustment by control of the back gate voltage is smaller than one step of the offset adjustment by the variable resistance circuit of the sensor section 41.

Figure 10:
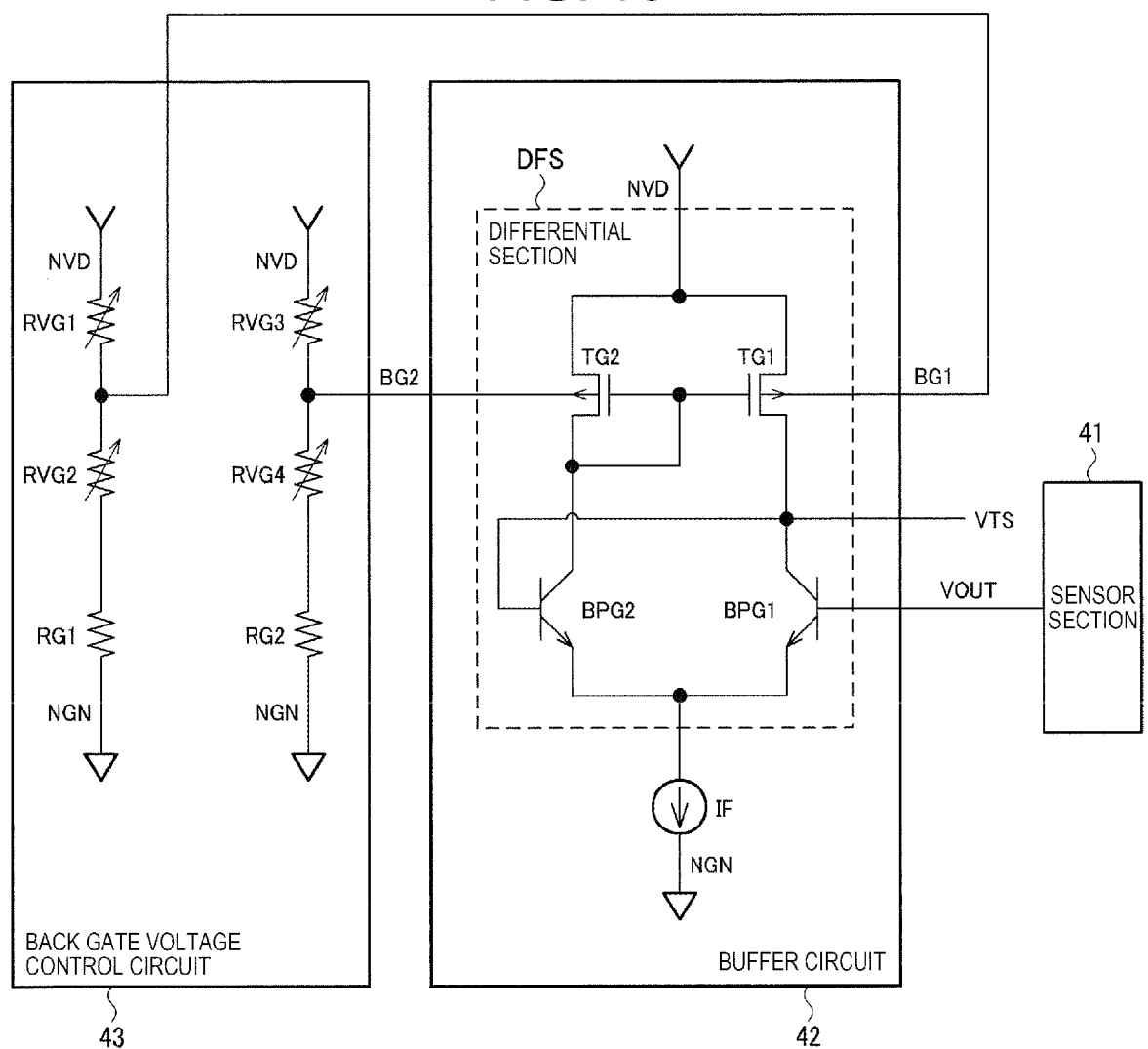
FIG. 10 shows a detailed configuration example of a buffer circuit and a back gate voltage control circuit.

FIG. 10 shows a detailed configuration example of a buffer circuit 42 and a back gate voltage control circuit 43.

The buffer circuit 42 includes a differential section DFS and a constant current circuit IF. The differential section DFS includes P-type transistors TG1 and TG2 and bipolar transistors BPG1 and BPG2. TG1, TG2, BPG1, and BPG2 are a first transistor, a second transistor, a first differential pair transistor, and a second differential pair transistor, respectively.

The P-type transistors TG1 and TG2 constitute the current mirror circuit. That is, sources of the P-type transistors TG1 and TG2 are coupled to the power supply node NVD, and a gate of the P-type transistor TG2 is coupled to a gate of the P-type transistor TG1 and a drain of the P-type transistor TG2.

A differential pair constituted by the bipolar transistors BPG1 and BPG2 is coupled to the current mirror circuit. That is, the collector nodes of the bipolar transistors BPG1 and BPG2 are coupled to the drains of the P-type transistors TG1 and TG2, respectively. The emitter nodes of the bipolar transistors BPG1 and BPG2 are coupled to one end of the constant current circuit IF. The other end of the constant current circuit IF is coupled to the ground node NGN.

The buffer circuit 42 is a voltage follower circuit. Specifically, the output voltage VOUT from the sensor section 41 is input to a base node of the bipolar transistor BPG1. The collector node of the bipolar transistor BPG1 is an output node of the buffer circuit 42, and the output node is coupled to a base node of the bipolar transistor BPG2. The buffer circuit 42 outputs the collector voltage of the bipolar transistor BPG1 as the temperature detection voltage VTS.

Note that the buffer circuit 42 may further include an output section that amplifies the output voltage of the differential section DFS. In this case, the differential section DFS outputs the collector voltage of the bipolar transistor BPG1 to the output section, and an output node of the output section is coupled to the base node of the bipolar transistor BPG2. The temperature detection voltage VTS is output from the output node of the output section.

The back gate voltage control circuit 43 controls the back gate voltage of the P-type transistor TG1 and the back gate voltage of the P-type transistor TG2. The back gate voltage control circuit 43 includes resistors RG1 and RG2, and variable resistor circuits RVG1 to RVG4.

The variable resistance circuits RVG1, RVG2 and resistor RG1 are coupled in series between the power supply node NVD and the ground node NGN. The variable resistance circuits RVG1, RVG2, and the resistance RG1 constitute a voltage dividing circuit that divides a power supply voltage, and a voltage BG1 that is a divided voltage, is output from a node between the variable resistance circuits RVG1 and RVG2. The back gate voltage control circuit 43 outputs a voltage BG1 to the back gate of the P-type transistor TG1. The variable resistance circuits RVG3 and RVG4 and the resistor RG2 constitute a voltage dividing circuit that divides the power supply voltage, and a voltage BG2 that is the divided voltage, is output from a node between the variable resistance circuits RVG3 and RVG4. The back gate voltage control circuit 43 outputs a voltage BG2 to the back gate of the P-type transistor TG2.

The following equation (4) shows a relational equation between a back gate voltage Vb and a threshold voltage Vth of the transistor. $V_{FB}$ is a flat band voltage, q is an element charge amount, $\phi F$ is a Fermi level, $\varepsilon_s \varepsilon_0$ is a relative dielectric constant, and $N_A$ is an impurity concentration of a well.

$$Vth = V_{FB} + 2\varphi_F + \frac{\sqrt{2\varepsilon_s \varepsilon_0 q N_A (2\varphi_F - Vb)}}{Cox} \quad (4)$$

From the above equation (4), it can be seen that the threshold voltage Vth changes as the back gate voltage Vb changes. That is, the back gate voltage control circuit 43 controls the back gate voltages of the P-type transistors TG1 and TG2, so that the threshold voltages of the P-type transistors TG1 and TG2 are controlled, and as a result, drain currents of the P-type transistors TG1 and TG2 change.

The non-volatile memory 70 in FIG. 1 stores back gate voltage control data for controlling the back gate voltage. The resistance values of the variable resistance circuits RVG1 to RVG4 are set based on the back gate voltage control data. For example, the voltage BG1 and the voltage BG2 change in the opposite directions. That is, the resistance values of the variable resistance circuits RVG1 to RVG4 are set so that the voltage BG2 decreases when the voltage BG1 is increased and the voltage BG2 increases when the voltage BG1 is decreased. Alternatively, the voltages BG1 and BG2 may be set independently.

Note that the back gate voltage control data is included in the zeroth-order correction data. That is, the zeroth-order correction data includes data for setting the resistance value of the variable resistance circuit RA in FIG. 5 and the back gate voltage control data. Alternatively, the zeroth-order correction data includes data for setting resistance values of the variable resistance circuits RA and RB in FIG. 6 and the back gate voltage control data.

According to the present embodiment, back gate voltages of the P-type transistors TG1 and TG2 constituting the current mirror circuit of the differential section DFS are controlled, so that the back gate voltages are supplied to bipolar transistors BPG1 and BPG2 constituting the differential pair. When a balance of currents supplied to the bipolar transistors BPG1 and BPG2 changes, the offset of the output voltage of the differential section DFS changes. That is, the offset of the temperature detection voltage VTS changes. As described above, the offset of the temperature detection voltage VTS can be controlled by controlling the back gate voltage.

Since no current flows through the back gate of the transistor, it is not necessary to supply a current to the back gate in controlling the back gate voltage. Therefore, the back gate voltage control circuit 43 can be made compact. Further, when the voltage BG1 and the voltage BG2 change in the opposite directions, a resolution of the offset adjustment can be halved compared to a case where only one of the voltage BG1 and the voltage BG2 is changed. In other words, the offset adjustment can be performed with twice the accuracy.

The case where the back gate voltage control circuit controls the back gate voltages of both the P-type transistors TG1 and TG2 has been described above, but the back gate voltage control circuit 43 may control at least one back gate voltage of the P-type transistors TG1 and TG2.

4. Temperature Compensation Circuit, Oscillation Circuit

Figure 11:
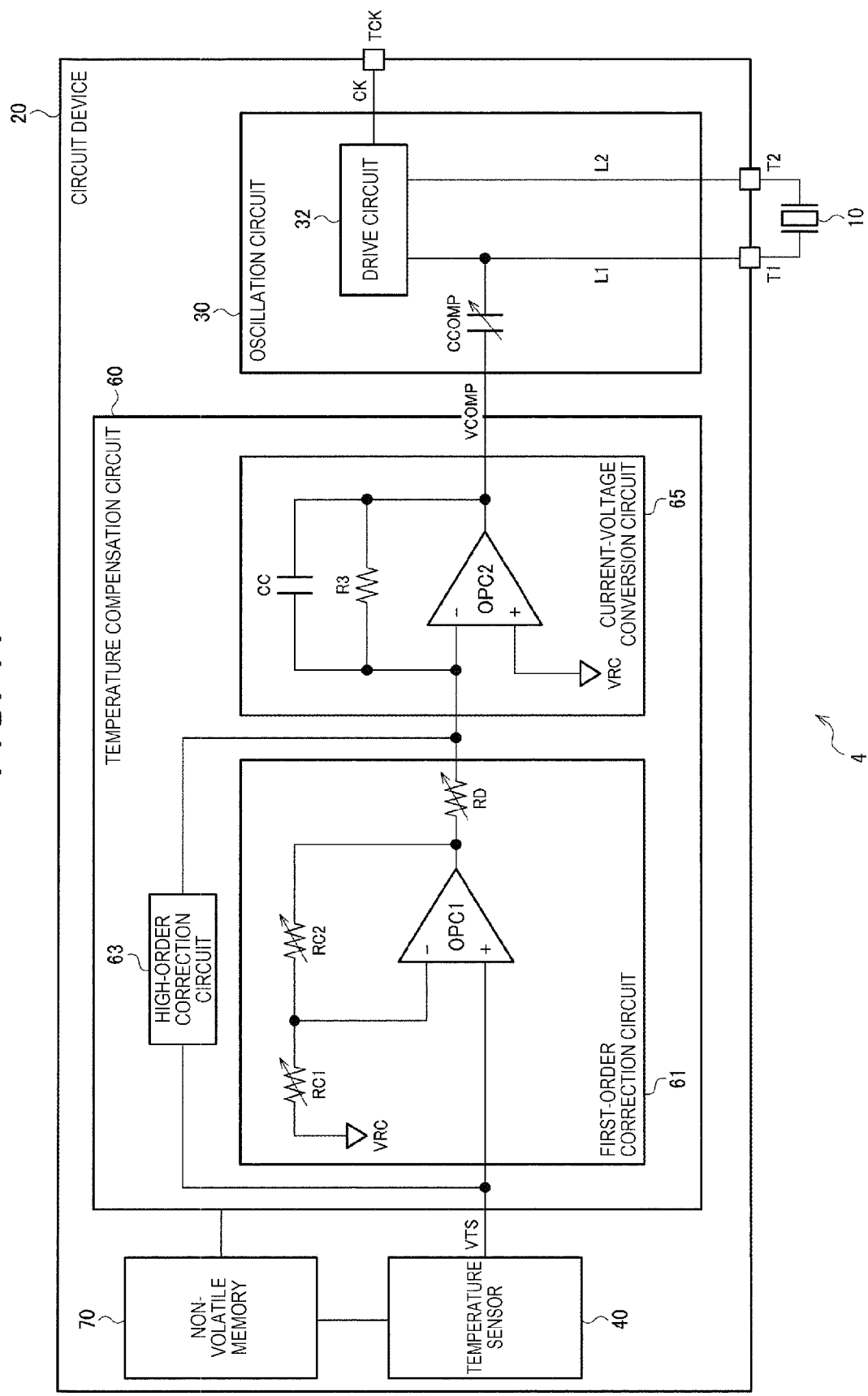
FIG. 11 shows a detailed configuration example of a temperature compensation circuit and an oscillation circuit.

FIG. 11 is a detailed configuration example of a temperature compensation circuit 60 and an oscillation circuit 30. The oscillation circuit 30 includes a drive circuit 32 and a variable capacitance capacitor CCOMP.

The drive circuit 32 is coupled to a terminal T1 via a node L1, and is coupled to a terminal T2 via a node L2. The drive circuit 32 oscillates a vibrator 10 by driving the vibrator 10 coupled to the terminals T1 and T2. The drive circuit 32 can be realized by a transistor such as a bipolar transistor and a passive element such as a capacitor or a resistor.

One end of the variable couple capacitor CCOMP is coupled to the node L1. Alternatively, one end of the variable capacitance capacitor CCOMP may be coupled to the node L2. The other end of the variable capacitance capacitor CCOMP is coupled to an output node of the temperature compensation circuit 60. The variable capacitance capacitor CCOMP is, for example, a MOS capacitor. One end of the MOS capacitor is a gate of the MOS transistor, and the other end of the MOS capacitor is a source and drain of the MOS transistor.

The temperature compensation circuit 60 includes a first-order correction circuit 61, a high-order correction circuit 63, and a current-voltage conversion circuit 65. In the present embodiment, the "function" is a function having temperature as a variable.

The first-order correction circuit 61 outputs a first-order current that approximates a linear function based on a temperature detection voltage VTS. The first-order correction circuit 61 includes a calculation amplifier OPC1 and variable resistance circuits RC1, RC2, and RD. The calculation amplifier OPC1 and the variable resistor circuits RC1 and RC2 constitute a forward amplification circuit, and the forward amplification circuit amplifies the temperature detection voltage VTS with reference to a reference voltage VRC. The forward amplification circuit outputs a first-order current to an input node of the current-voltage conversion circuit 65 via the variable resistance circuit RD.

A high-order correction circuit 63 outputs a third-order current that approximates a third-order function to an input node of the current-voltage conversion circuit 65 based on the temperature detection voltage VTS. The high-order correction circuit 63 includes a first differential circuit that performs a differential operation based on the temperature detection voltage VTS, and a second differential circuit that outputs the third-order current by performing a differential operation based on an output voltage of the first differential circuit and the temperature detection voltage VTS.

The current-voltage conversion circuit 65 adds the first-order current and the third-order current, and outputs a compensation voltage VCOMP by current-voltage converting the added current. Thereby, a compensation voltage VCOMP approximating a polynomial function is obtained. The compensation voltage VCOMP is input to the other end of the variable capacitor CCOMP. A capacitance value of the variable capacitance capacitor CCOMP is controlled by the compensation voltage VCOMP so that the oscillation frequency of the oscillation circuit 30 is temperature compensated. The current-voltage conversion circuit 65 includes a calculation amplifier OPC2, a resistor R3, and a capacitor CC. The resistor R3 and the capacitor CC are coupled in parallel between an output node and an inverting input node of the operational amplifier OPC2. The reference voltage VRC is input to a non-inverting input node of the calculation amplifier OPC2. The output node of the calculation amplifier OPC2 is coupled to the output node of the temperature compensation circuit 60.

The high-order correction circuit 63 may further include a correction circuit that performs a fourth-order or higher correction. For example, the high-order correction circuit 63 may further include a fourth-order correction circuit that outputs a fourth-order current approximating a fourth-order function, and a fifth-order correction circuit that outputs a fifth-order current approximating a fifth-order function.

5. Oscillator

Figure 12:
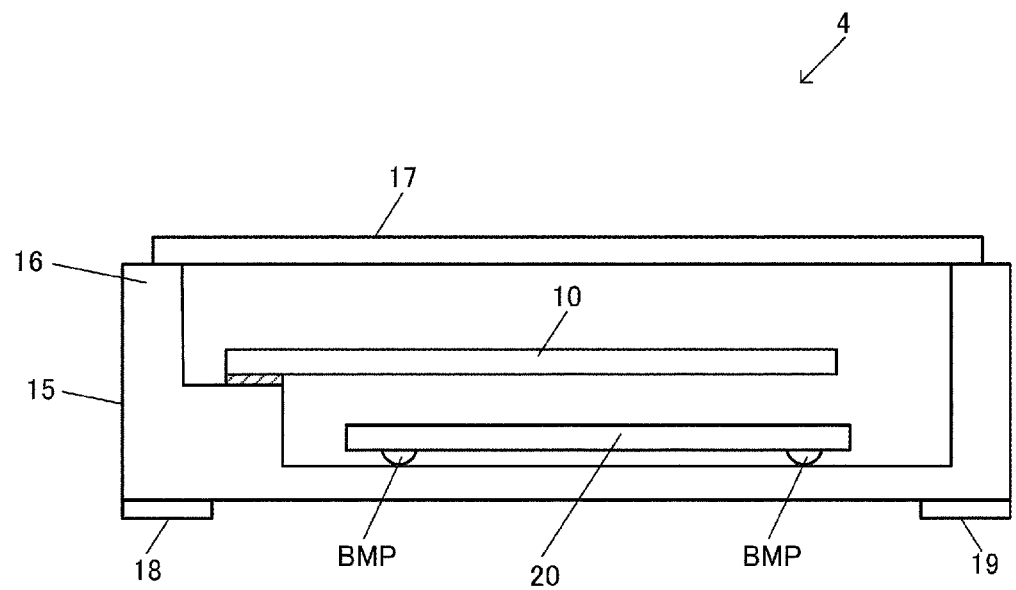
FIG. 12 shows a first structural example of an oscillator.

Next, a structural example of the oscillator 4 of the present embodiment will be described. FIG. 12 shows a first structural example of the oscillator 4. The oscillator 4 has the vibrator 10, the circuit device 20, and the package 15 that accommodates the vibrator 10 and the circuit device 20. The package 15 is made of, for example, ceramic or the like, and has an accommodation space inside thereof, and the vibrator and the circuit device 20 are accommodated in the accommodation space. The accommodation space is hermetically sealed and is preferably in a reduced pressure state that is close to a vacuum state. With the package 15, the vibrator 10 and the circuit device 20 can be suitably protected from impact, dust, heat, moisture, and the like.

The package 15 has a base 16 and a lid 17. Specifically, the package 15 includes a base 16 that supports the vibrator 10 and the circuit device 20, and a lid 17 that is bonded to the upper surface of the base 16 so as to form an accommodation space with the base 16. And the vibrator 10 is supported by the step portion provided inside the base 16 via the terminal electrode. The circuit device 20 is disposed on the inner bottom surface of the base 16. Specifically, the circuit device 20 is disposed such that the active surface faces the inner bottom surface of the base 16. The active surface is a surface on which circuit elements of the circuit device 20 are formed. Further, bumps BMP are formed on terminals that are pads of the circuit device 20. The circuit device 20 is supported on the inner bottom surface of the base 16 via the conductive bumps BMP. The conductive bump BMP is, for example, a metal bump, and the vibrator 10 and the circuit device 20 are electrically coupled to each other via the bump BMP, the internal wiring of the package 15, the terminal electrode, or the like. The circuit device 20 is electrically coupled to the external terminals 18 and 19 of the oscillator 4 via the bumps BMP or the internal wiring of the package 15. The external terminals 18 and 19 are formed on the outer bottom surface of the package 15. The external terminals 18 and 19 are coupled to an external device via the external wirings. The external wiring is, for example, a wiring or the like formed on a circuit substrate on which an external device is mounted. Thereby, a clock signal or the like can be output to the external device.

In FIG. 12, the circuit device 20 is flip-mounted so that the active surface of the circuit device 20 faces downward, but the present embodiment is not limited to such mounting. For example, the circuit device 20 may be mounted so that the active surface of the circuit device 20 faces upward. That is, the circuit device 20 is mounted so that the active surface faces the vibrator 10.

Figure 13:
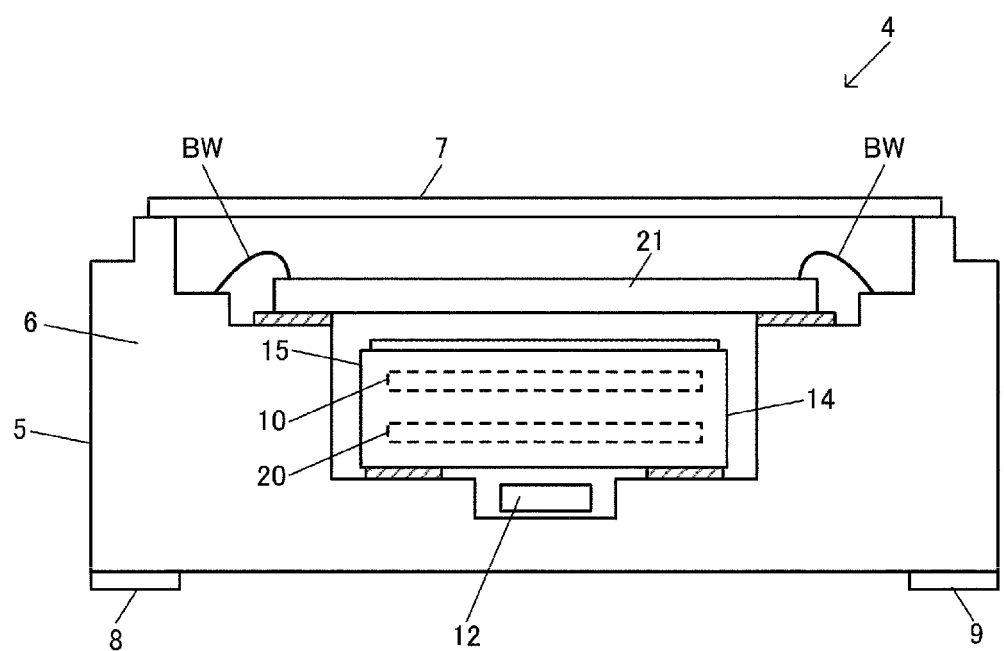
FIG. 13 shows a second structural example of the oscillator.

FIG. 13 shows a second structural example of the oscillator 4. The oscillator 4 in FIG. 13 includes a vibrator 10, a circuit device 20, and a circuit device 21. The oscillator 4 also includes the package 15 accommodating the vibrator 10 and the circuit device 20, and a package 5 accommodating the package 15 and the circuit device 21. The package 15 and the package 5 are a first package and a second package, respectively. The first package and the second package can also be referred to as a first container and a second container.

In the present embodiment, the circuit device 20 accommodated in the package 15 performs the first temperature compensation processing, and the circuit device 21 accommodated in the package 5 performs the second temperature compensation processing. For example, the vibrator 10 and the circuit device 20 are accommodated in the package 15, so that a temperature compensation type oscillator 14 that performs, for example, an analog-mode first temperature compensation processing is configured. Further, the oscillator 14 that performs analog-mode first temperature compensation processing and the circuit device 21 that performs digital-mode second temperature compensation processing are accommodated in the package 5, so that the oscillator 4 that generates highly accurate clock signal is configured. The circuit device 21 can also be called a correction IC that performs the second temperature compensation processing with a fine adjustment in a digital-mode.

Specifically, the package 5 is made of, for example, ceramic or the like, and has an accommodation space inside thereof. In this accommodation space, the oscillator 14, in which the vibrator 10 and the circuit device 20 are accommodated in the package 15, and the circuit device 21 are accommodated. The accommodation space is hermetically sealed and is preferably in a reduced pressure state that is close to a vacuum state. With the package 5, the circuit device 21 and the oscillator 14 can be suitably protected from impact, dust, heat, moisture, and the like.

The package 5 has a base 6 and a lid 7. Specifically, the package 5 includes a base 6 that supports the oscillator 14 and the circuit device 21, and a lid 7 that is bonded to the upper surface of the base 6 so as to form an accommodation space with the base 6. The base 6 has a first recess portion opening on the upper surface and a second recess portion opening on the bottom surface of the first recess portion. The circuit device 21 is supported on the bottom surface of the first recess portion. For example, the circuit device 21 is supported by a step portion on the bottom surface via a terminal electrode. The oscillator 14 is supported on the bottom surface of the second recess portion. For example, the oscillator 14 is supported by the step portion on the bottom surface via the terminal electrode. Further, the base 6 has a third recess portion opening in the bottom surface of the second recess portion, and the circuit component 12 is disposed in the third recess portion. For example, a capacitor or a temperature sensor can be assumed as the circuit component 12 to be disposed.

The circuit device 21 is electrically coupled to a terminal of the oscillator 14 via, for example, a bonding wire BW, a terminal electrode formed in a step portion, or an internal wiring of the package 5. Thereby, the clock signal or the temperature detection signal from the oscillator 14 can be input to the circuit device 21. Further, the circuit device 21 is electrically coupled to an external terminals 8 and 9 of the oscillator 4 via the bonding wire BW, the terminal electrode formed in the step portion, and the internal wiring of the package 5. The external terminals 8 and 9 are formed on the outer bottom surface of the package 5. The external terminals 8 and 9 are coupled to an external device via the external wirings. The external wiring is, for example, a wiring or the like formed on a circuit substrate on which an external device is mounted. Thereby, a clock signal or the like can be output to the external device. Note that the terminal of the oscillator 14 and the external terminals 8 and 9 may be electrically coupled with each other.

In FIG. 13, the circuit device 21 is disposed in the upward direction of the oscillator 14, but the circuit device 21 may be disposed in the downward direction of the oscillator 14. The upward direction is a direction from the bottom surface of the package 5 toward the lid 7, and the downward direction is the opposite direction. The circuit device 21 may be provided on the side of the oscillator 14. That is, the oscillator 14 and the circuit device 21 are arranged side by side so as to be aligned in an upper surface view of the oscillator 4.

Next, the circuit device 21 will be described. The circuit device 21 includes a clock signal generation circuit to which a first clock signal that is a clock signal generated by the oscillator 14 is input as a reference clock signal. The clock signal generated by the clock signal generation circuit is output to the outside as an output clock signal of the oscillator 4. For example, the clock signal generation circuit of the circuit device 21 is constituted by a fractional N-type PLL circuit to which the first clock signal from the oscillator 14 is input as a reference clock signal. The PLL circuit performs a phase comparison of a reference clock signal that is a first clock signal and a feedback clock signal obtained by dividing the output clock signal of the PLL circuit by a frequency dividing circuit. A fractional N-type PLL circuit is realized by setting a fractional division ratio using a delta sigma modulator. Further, the control circuit included in the circuit device 21 performs correction processing of the division ratio data set in the PLL circuit based on the temperature compensation data, thereby the second temperature compensation processing is realized. The first temperature compensation processing performed in the oscillator 14 is realized by, for example, polynomial approximation temperature compensation processing performed by the temperature compensation circuit 60 shown in FIGS. 1 and 11.

The clock signal generation circuit may be constituted by a direct digital synthesizer. In this case, the second temperature compensation processing is realized by inputting the frequency control data corrected by the temperature compensation data with respect to the direct digital synthesizer that operates using the first clock signal as a reference clock signal.

According to the oscillator 4 in FIG. 13, the circuit device 20 that oscillates the vibrator 10 performs the first temperature compensation processing, thereby the amount of the frequency fluctuation in the frequency-temperature characteristics of the first clock signal which is output from the circuit device 20 that is a first circuit device, can be reduced. Further, the circuit device 21 that is the second circuit device performs the second temperature compensation processing when the clock signal is generated based on the first clock signal from the circuit device 20. As described above, the second temperature compensation processing is performed by the circuit device 21 after the first temperature compensation processing is performed by the circuit device 20, thereby it becomes possible to reduce or the like the microjump of frequency caused by variation of the temperature measurement result or the like, and possible to realize the clock frequency of the oscillator 4 with high accuracy or the like. In the oscillator 4 in FIG. 13, the first temperature compensation processing may be performed using a temperature sensor provided in the circuit device 20, and a temperature detection signal of this temperature sensor may be output from the circuit device 20 and input to the circuit device 21. The circuit device 21 may perform the second temperature compensation processing based on the input temperature detection signal. As described above, the first temperature compensation processing in the circuit device 20 and the second temperature compensation processing in the circuit device 21 can be performed based on the temperature detection signal from the same temperature sensor so that more appropriate temperature compensation processing can be realized. In this case, a distance between the temperature sensor built in the circuit device 20 and the vibrator 10 is shorter than a distance between the temperature sensor and the circuit device 21. Accordingly, by performing the digital temperature compensation processing, the distance between the circuit device 21 that generates a large amount of heat and the vibrator 10 can be increased, and the adverse effect of the heat generated by the circuit device 21 on the temperature detection result of the temperature sensor can be reduced. Therefore, the temperature of the vibrator 10 can be measured more accurately using the temperature sensor built in the circuit device 20.

6. Electronic Apparatus and Vehicle

Figure 14:
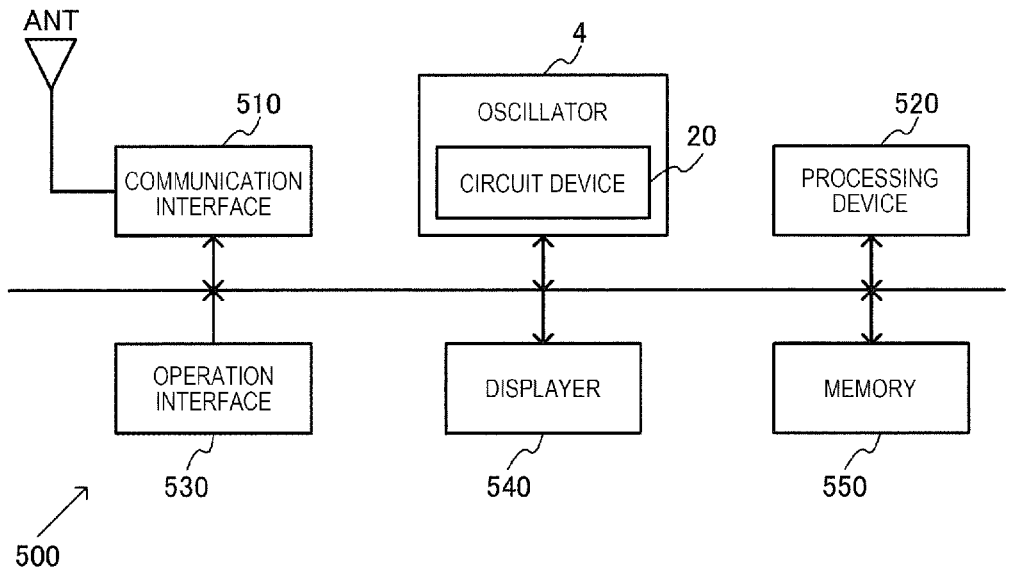
FIG. 14 shows a configuration example of an electronic apparatus.

FIG. 14 shows a configuration example of an electronic apparatus 500 including the circuit device 20 of the present embodiment. The electronic apparatus 500 includes the circuit device 20 of the present embodiment and a processing device 520 that operates by a clock signal based on the oscillation signal of the oscillation circuit 30 of the circuit device 20. Specifically, the electronic apparatus 500 includes the oscillator 4 having the circuit device 20 of the present embodiment, and the processing device 520 operates based on the clock signal from the oscillator 4. The electronic apparatus 500 can include an antenna ANT, a communication interface 510, an operation interface 530, a displayer 540, and a memory 550. The electronic apparatus 500 is not limited to the configuration shown in FIG. 14, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

Further, as the electronic apparatus 500, there is an apparatus used in a next generation mobile communication system such as 5G. For example, the circuit device 20 of the present embodiment can be used in various apparatuses such as a base station, a remote radio head (RRH), or a mobile communication terminal of a next generation mobile communication system. In the next generation mobile communication system, a highly accurate clock frequency is required for time synchronization and the like, which is suitable as an application example of the circuit device 20 of the present embodiment that can generate a highly accurate clock signal.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various types of information and can be realized by a display such as a liquid crystal or an organic EL. The memory 550 stores data, and the function can be realized by a semiconductor memory such as a RAM or a ROM.

In FIG. 14, the case where the electronic apparatus 500 includes the oscillator 4 is described as an example. However, the configuration of the electronic apparatus 500 is not limited to this, and the electronic apparatus 500 only needs to include the circuit device 20. That is, the circuit device 20 only needs to include a temperature sensor and a circuit that operates based on the temperature detection voltage from the temperature sensor. At this time, the processing device 520 operates based on an output signal from the circuit device 20. The output signal from the circuit device 20 is, for example, a signal generated by the circuit device 20 using the temperature detection voltage.

Figure 15:
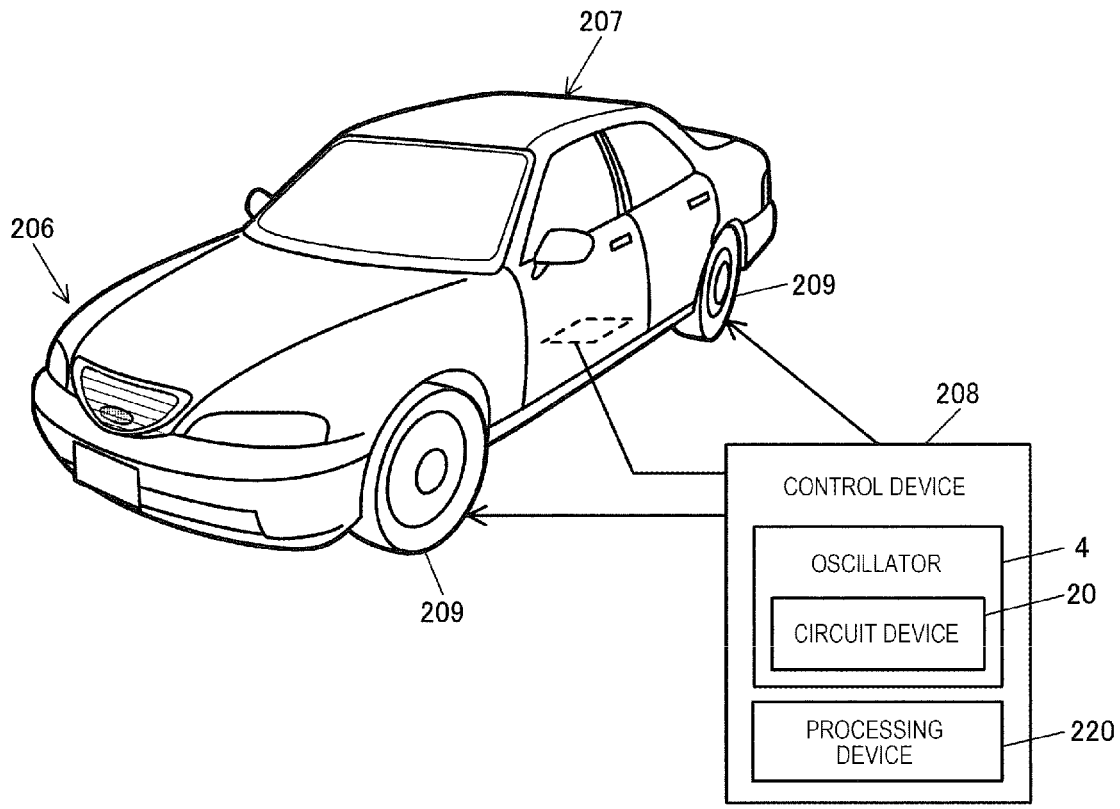
FIG. 15 shows a configuration example of a vehicle.

FIG. 15 shows an example of a vehicle including the circuit device 20 of the present embodiment. The vehicle includes the circuit device 20 of the present embodiment and a processing device 220 that operates by a clock signal based on an oscillation signal of the oscillation circuit 30 of the circuit device 20. Specifically, the vehicle includes the oscillator 4 having the circuit device 20 of the present embodiment, and the processing device 220 operates based on the clock signal from the oscillator 4. The circuit device 20 of the present embodiment can be incorporated into various vehicles such as vehicles, airplanes, motorcycles, bicycles, or ships. The vehicle is an apparatus/device that moves on the ground, in the sky, or on the sea, and includes a driving mechanism such as an engine or a motor, a steering mechanism such as a steering wheel or a rudder, and various electronic apparatuses. FIG. 15 schematically shows an automobile 206 as a specific example of the vehicle. The automobile 206 incorporates the circuit device 20 of the present embodiment. Specifically, the automobile 206 that is a vehicle includes a control device 208, and the control device 208 includes the oscillator 4 including the circuit device 20 of the present embodiment and a processing device 220 operating based on a clock signal generated by the oscillator 4. The control device 208, for example, controls the hardness of the suspension according to the posture of a vehicle body 207, and controls brakes of the individual wheels 209. For example, automatic driving of the automobile 206 may be realized by the control device 208. The apparatus in which the circuit device 20 of the present embodiment is incorporated is not limited to such a control device 208, and can be incorporated in various in-vehicle apparatuses such as a meter panel apparatus and a navigation apparatus provided in a vehicle such as the automobile 206.

Note that although a case where a vehicle includes the oscillator 4 is described as an example in FIG. 15, the configuration of the vehicle is not limited to this, and the moving body only needs to include the circuit device 20. That is, the circuit device 20 only needs to include a temperature sensor and a circuit that operates based on the temperature detection voltage from the temperature sensor. At this time, the processing device 220 operates based on an output signal from the circuit device 20. The output signal from the circuit device 20 is, for example, a signal generated by the circuit device 20 using the temperature detection voltage.

As described above, a temperature sensor according to the present embodiment outputs a temperature detection voltage. The temperature sensor includes a first bipolar transistor, a first resistor, and a first variable resistance circuit. The first resistor is provided between a first node and a first collector node. The first node is coupled to a first base node. The first base node is a base node of the first bipolar transistor. The first collector node is a collector node of the first bipolar transistor. The first variable resistance circuit is provided between a first emitter node and a ground node. The first emitter node is an emitter node of the first bipolar transistor.

According to the present embodiment, the first variable resistance circuit is provided between the emitter node of the first bipolar transistor and the ground node, so that a voltage drop in the first variable resistance circuit is added to a voltage between the base and emitter of the first bipolar transistor. Thereby, a resistance value of the first variable resistance circuit is variably adjusted, so that an offset of the temperature detection voltage based on the voltage between the base and emitter is variably adjusted. In this way, the offset of the temperature detection voltage can be corrected with a simple circuit configuration in which the first variable resistance circuit is provided. Further, according to the present embodiment, the first variable resistance circuit is provided between the emitter node of the first bipolar transistor and the ground node, so that an influence of a power supply voltage and the like can be reduced. Thereby, the offset of the temperature detection voltage can be corrected with high accuracy.

In the present embodiment, the temperature sensor may include a constant current circuit. The constant current circuit may be provided between a power supply node and the first node, and may output a constant current to the first node.

In this way, the constant current flows through the first resistor, the first bipolar transistor, and the first variable resistance circuit. When the constant current flows through the first bipolar transistor, a voltage between the base and emitter depending on temperature is generated. Further, since the voltage drop in accordance with the resistance value of the first variable resistance circuit occurs when the constant current flows through the first variable resistance circuit, the offset of the temperature detection voltage is adjusted by adjusting the resistance value of the first variable resistance circuit.

In the present embodiment, the first variable resistance circuit may include a plurality of resistors and a plurality of switches. The plurality of resistors may be coupled in series between the first emitter node and the ground node. Each switch of the plurality of switches may be coupled between one end of one of the plurality of resistors and the ground node.

In this way, when one of the plurality of switches is turned on, one end of the resistor, to which the switch is coupled, and the ground node are coupled by the switch. That is, a current bypass path by a switch is provided between one end of the resistor and the ground node. Accordingly, the resistance value of the first variable resistance circuit is adjusted by selecting which one of the plurality of switches is to be turned on.

In the present embodiment, the temperature sensor may include a buffer circuit and a back gate voltage control circuit. The buffer circuit may output the temperature detection voltage by buffering the output voltage from the first collector node. The buffer circuit may have a differential section. The differential section may include a current mirror circuit and a differential pair electrically coupled to the current mirror circuit. The current mirror circuit may be constituted by a first transistor and a second transistor that are MOS transistors. The differential pair may be constituted by a first differential pair transistor and a second differential pair transistor that are bipolar transistors. The output voltage from the first collector node may be input to a base node of the first differential pair transistor. The output node of the buffer circuit may be electrically coupled to a base node of the second differential pair transistor. A back gate voltage control circuit may control at least one of a back gate voltage of the first transistor and a back gate voltage of the second transistor.

In this way, the back gate voltages of the first transistor and the second transistor constituting the current mirror circuit of the differential section are controlled, so that a current supplied to the first differential pair transistor and the second differential pair transistor constituting the differential pair is controlled. When a balance of the current supplied to the first differential pair transistor and the second differential pair transistor changes, an offset of an output voltage of the differential section changes. That is, the offset of the temperature detection voltage changes. As described above, the offset of the temperature detection voltage can be controlled by controlling the back gate voltage.

In the present embodiment, the temperature sensor may include a second bipolar transistor, a second resistor, and a second variable resistance circuit. The second resistor may be provided between a second node and a second collector node. The second node may be coupled to a second base node. The second base node may be a base node of the second bipolar transistor. The second collector node may be a collector node of the second bipolar transistor. The second variable resistance circuit may be provided between a second emitter node and the first collector node. The second emitter node may be an emitter node of the second bipolar transistor.

In this way, a second variable resistance circuit is provided between the emitter node of the second bipolar transistor and the collector node of the first bipolar transistor, so that a voltage drop in the second variable resistance circuit is added to a voltage between the base and emitter of the second bipolar transistor. Thereby, a resistance value of the second variable resistance circuit is variably adjusted, so that an offset of the temperature detection voltage based on the voltage between the base and emitter is variably adjusted. Further, according to the present embodiment, since the voltage between the base and emitter of the first bipolar transistor and the voltage between the base and emitter of the second bipolar transistor are added, the sensitivity of the temperature detection voltage with respect to temperature can be improved.

Further, a temperature sensor according to the present embodiment may have the following configuration. That is, the temperature sensor outputs a temperature detection voltage. The temperature sensor includes a first bipolar transistor, a first resistor, a second bipolar transistor, a second resistor, and a variable resistance circuit. The first resistor is provided between a first node coupled to a first base node that is a base node of the first bipolar transistor and a first collector node that is a collector node of the first bipolar transistor. The second resistor is provided between a second node coupled to a second base node that is a base node of the second bipolar transistor and a second collector node that is a collector node of the second bipolar transistor. The variable resistance circuit is provided between a second emitter node that is an emitter node of the second bipolar transistor and the first collector node.

In this way, a variable resistance circuit is provided between the emitter node of the second bipolar transistor and the collector node of the first bipolar transistor, so that a voltage drop in the variable resistance circuit is added to a voltage between the base and emitter of the second bipolar transistor. Thereby, a resistance value of the variable resistance circuit is variably adjusted, so that an offset of the temperature detection voltage based on the voltage between the base and emitter is variably adjusted.

In the present embodiment, the temperature sensor may include a buffer circuit and a back gate voltage control circuit. The buffer circuit may output the temperature detection voltage by buffering the output voltage from the second collector node. The buffer circuit may have a differential section. The differential section may include a current mirror circuit and a differential pair electrically coupled to the current mirror circuit. The current mirror circuit may be constituted by a first transistor and a second transistor that are MOS transistors. The differential pair may be constituted by a first differential pair transistor and a second differential pair transistor that are bipolar transistors. The output voltage from the second collector node may be input to a base node of the first differential pair transistor. The output node of the buffer circuit may be electrically coupled to a base node of the second differential pair transistor. A back gate voltage control circuit may control at least one of a back gate voltage of the first transistor and a back gate voltage of the second transistor.

In this way, the back gate voltages of the first transistor and the second transistor constituting the current mirror circuit of the differential section are controlled, so that a current supplied to the first differential pair transistor and the second differential pair transistor constituting the differential pair is controlled. When a balance of the current supplied to the first differential pair transistor and the second differential pair transistor changes, an offset of an output voltage of the differential section changes. That is, the offset of the temperature detection voltage changes. As described above, the offset of the temperature detection voltage can be controlled by controlling the back gate voltage.

The circuit device according to the present embodiment includes any of the temperature sensors described above and a circuit that operates based on a temperature detection voltage from the temperature sensor.

Further, the circuit device according to the present embodiment may have the following configuration. That is, the circuit device includes any of the temperature sensors described above, an oscillation circuit that oscillates a vibrator, and a temperature compensation circuit. The temperature compensation circuit outputs a temperature compensation signal that temperature compensates an oscillation frequency of the oscillation circuit based on the temperature detection voltage from the temperature sensor.

An oscillator according to the present embodiment includes the above-described circuit device and a vibrator.

An electronic apparatus according to the present embodiment includes any of the circuit devices described above and a processing device that operates based on an output signal from the circuit device.

A vehicle according to the present embodiment includes any of the circuit devices described above and a processing device that operates based on an output signal from the circuit device.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configuration, operation, and the like of the temperature sensor, circuit device, oscillator, electronic apparatus, vehicle, and the like are not limited to those described in the present embodiment, and various modifications can be made.

What is claimed is:

1. A temperature sensor for outputting a temperature detection voltage, comprising:
    a first bipolar transistor;
    a first resistor provided between a first node coupled to a first base node that is a base node of the first bipolar transistor and a first collector node that is a collector node of the first bipolar transistor;
    a first variable resistance circuit provided between a first emitter node that is an emitter node of the first bipolar transistor and a ground node; and
    a constant current circuit provided between a power supply node and the first node and outputting a constant current to the first node.

2. A circuit device comprising:
    the temperature sensor according to claim 1; and a circuit operating based on the temperature detection voltage from the temperature sensor.

3. A circuit device comprising:
the temperature sensor according to claim 1;
an oscillation circuit oscillating a vibrator; and
a temperature compensation circuit outputting a temperature compensation signal that temperature compensates an oscillation frequency of the oscillation circuit based on the temperature detection voltage from the temperature sensor.

4. An oscillator comprising:
the circuit device according to claim 3; and
the vibrator.

5. A temperature sensor for outputting a temperature detection voltage, comprising:
a first bipolar transistor;
a first resistor provided between a first node coupled to a first base node that is a base node of the first bipolar transistor and a first collector node that is a collector node of the first bipolar transistor;
a first variable resistance circuit provided between a first emitter node that is an emitter node of the first bipolar transistor and a ground nod,
wherein
the first variable resistance circuit includes
a plurality of resistors coupled in series between the first emitter node and the ground node, and
a plurality of switches each of which is coupled between one end of one of the plurality of resistors and the ground node.

6. A circuit device comprising:
the temperature sensor according to claim 5; and
a circuit operating based on the temperature detection voltage from the temperature sensor.

7. A circuit device comprising:
the temperature sensor according to claim 3;
an oscillation circuit oscillating a vibrator; and
a temperature compensation circuit outputting a temperature compensation signal that temperature compensates an oscillation frequency of the oscillation circuit based on the temperature detection voltage from the temperature sensor.

8. An oscillator comprising:
the circuit device according to claim 7; and
the vibrator.

9. A temperature sensor for outputting a temperature detection voltage, comprising:
a first bipolar transistor;
a first resistor provided between a first node coupled to a first base node that is a base node of the first bipolar transistor and a first collector node that is a collector node of the first bipolar transistor;
a first variable resistance circuit provided between a first emitter node that is an emitter node of the first bipolar transistor and a ground nod;
a buffer circuit outputting the temperature detection voltage by buffering an output voltage from the first collector node; and
a back gate voltage control circuit, wherein
the buffer circuit has a differential section having a current mirror circuit and a differential pair that is electrically coupled to the current mirror circuit,
the current mirror circuit is constituted by a first transistor and a second transistor that are MOS transistors,
the differential pair is constituted by a first differential pair transistor and a second differential pair transistor that are bipolar transistors,
the output voltage from the first collector node is input to a base node of the first differential pair transistor, and an output node of the buffer circuit is electrically coupled to a base node of the second differential pair transistor, and
the back gate voltage control circuit controls at least one of a back gate voltage of the first transistor and a back gate voltage of the second transistor.

10. A circuit device comprising:
the temperature sensor according to claim 9; and
a circuit operating based on the temperature detection voltage from the temperature sensor.

11. A circuit device comprising:
the temperature sensor according to claim 9;
an oscillation circuit oscillating a vibrator; and
a temperature compensation circuit outputting a temperature compensation signal that temperature compensates an oscillation frequency of the oscillation circuit based on the temperature detection voltage from the temperature sensor.

12. An oscillator comprising:
the circuit device according to claim 11; and
the vibrator.

13. A temperature sensor for outputting a temperature detection voltage, comprising:
a first bipolar transistor;
a first resistor provided between a first node coupled to a first base node that is a base node of the first bipolar transistor and a first collector node that is a collector node of the first bipolar transistor;
a first variable resistance circuit provided between a first emitter node that is an emitter node of the first bipolar transistor and a ground nod;
a second bipolar transistor;
a second resistor provided between a second node coupled to a second base node that is a base node of the second bipolar transistor and a second collector node that is a collector node of the second bipolar transistor; and
a second variable resistance circuit provided between a second emitter node that is an emitter node of the second bipolar transistor and the first collector node.

14. The temperature sensor according to claim 13, further comprising:
a buffer circuit outputting the temperature detection voltage by buffering an output voltage from the second collector node; and
a back gate voltage control circuit, wherein
the buffer circuit has a differential section having a current mirror circuit and a differential pair that is electrically coupled to the current mirror circuit,
the current mirror circuit is constituted by a first transistor and a second transistor that are MOS transistors,
the differential pair is constituted by a first differential pair transistor and a second differential pair transistor that are bipolar transistors,
the output voltage from the second collector node is input to a base node of the first differential pair transistor, and an output node of the buffer circuit is electrically coupled to a base node of the second differential pair transistor, and
the back gate voltage control circuit controls at least one of a back gate voltage of the first transistor and a back gate voltage of the second transistor.

15. A circuit device comprising:
the temperature sensor according to claim 13; and
a circuit operating based on the temperature detection voltage from the temperature sensor.

16. A circuit device comprising:
the temperature sensor according to claim 13;
an oscillation circuit oscillating a vibrator; and
a temperature compensation circuit outputting a temperature compensation signal that temperature compensates an oscillation frequency of the oscillation circuit based on the temperature detection voltage from the temperature sensor.

17. A temperature sensor for outputting a temperature detection voltage, comprising:
a first bipolar transistor;
a first resistor provided between a first node coupled to a first base node that is a base node of the first bipolar transistor and a first collector node that is a collector node of the first bipolar transistor;
a second bipolar transistor;
a second resistor provided between a second node coupled to a second base node that is a base node of the second bipolar transistor and a second collector node that is a collector node of the second bipolar transistor; and
a variable resistance circuit provided between a second emitter node that is an emitter node of the second bipolar transistor and the first collector node.

18. An oscillator comprising:
the circuit device according to claim 16; and
the vibrator.

19. The temperature sensor according to claim 17, further comprising:
a buffer circuit outputting the temperature detection voltage by buffering an output voltage from the second collector node; and
a back gate voltage control circuit, wherein
the buffer circuit has a differential section having a current mirror circuit and a differential pair that is electrically coupled to the current mirror circuit,
the current mirror circuit is constituted by a first transistor and a second transistor that are MOS transistors,
the differential pair is constituted by a first differential pair transistor and a second differential pair transistor that are bipolar transistors,
the output voltage from the second collector node is input to a base node of the first differential pair transistor, and an output node of the buffer circuit is electrically coupled to a base node of the second differential pair transistor, and
the back gate voltage control circuit controls at least one of a back gate voltage of the first transistor and a back gate voltage of the second transistor.

20. An electronic apparatus comprising:
the circuit device according to claim 19; and
a processing device operating based on an output signal from the circuit device.

21. A vehicle comprising:
the circuit device according to claim 19; and
a processing device operating based on an output signal from the circuit device.

* * * * *